United States Patent
Hwang

(10) Patent No.: US 12,554,079 B2
(45) Date of Patent: Feb. 17, 2026

(54) INTEGRATED PHOTONICS PACKAGE AND METHOD OF FORMING SAME

(71) Applicant: OIP Technology Pte Ltd., Singapore (SG)

(72) Inventor: How Yuan Hwang, Singapore (SG)

(73) Assignee: OIP Technology Pte Ltd., Singapore (SG)

( * ) Notice: Subject to any disclaimer, the term of this patent is extended or adjusted under 35 U.S.C. 154(b) by 281 days.

(21) Appl. No.: 18/488,512

(22) Filed: Oct. 17, 2023

(65) Prior Publication Data

US 2025/0004216 A1 Jan. 2, 2025

(30) Foreign Application Priority Data

Jun. 29, 2023 (CN) .......................... 202310788130.5

(51) Int. Cl.
*G02B 6/42* (2006.01)
(52) U.S. Cl.
CPC ......... *G02B 6/4214* (2013.01); *G02B 6/4269* (2013.01)
(58) Field of Classification Search
CPC ............................ G02B 6/4214; G02B 6/4269
See application file for complete search history.

(56) References Cited

U.S. PATENT DOCUMENTS 10,921,534 B2 * 2/2021 Dong .................. G02B 6/4245
2014/0010498 A1 * 1/2014 Verslegers ............... G02B 6/26
385/37

* cited by examiner

*Primary Examiner* — Michael P Mooney
(74) *Attorney, Agent, or Firm* — MUNCY, GEISSLER, OLDS & LOWE, P.C.

(57) ABSTRACT

An integrated photonics package and a method of forming it are disclosed. The integrated photonics package includes, encapsulated in a plastic encapsulation layer, an electrical signal module, a silicon photonics processing unit, a light-emitting unit, a heat sink structure and a micro-optical coupler. The electrical signal module is electrically connected and configured to both the silicon photonics processing unit and the light-emitting unit. The silicon photonics processing unit, the light-emitting unit and the micro-optical coupler are spaced apart, and the silicon photonics processing unit is located between the light-emitting unit and the micro-optical coupler. The light-emitting unit is configured to provide horizontal light, which is then processed by the silicon photonics processing unit and guided by the micro-optical coupler to vertically exit the integrated photonics package, thereby achieving in-package optical interconnection.

20 Claims, 1 Drawing Sheet

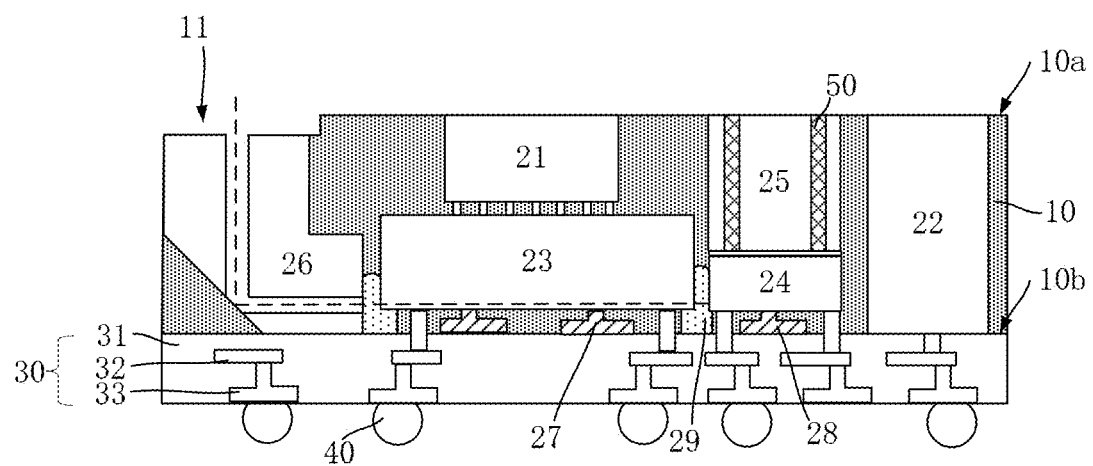

INTEGRATED PHOTONICS PACKAGE AND METHOD OF FORMING SAME

CROSS-REFERENCES TO RELATED APPLICATION

This application claims the priority of Chinese patent application number 202310788130.5, filed on Jun. 29, 2023, the entire contents of which are incorporated herein by reference.

TECHNICAL FIELD

The present invention relates to the field of integrated circuit technology and, in particular, to an integrated photonics package and a method of forming it.

BACKGROUND

Existing photonics packaging mainly includes chip-on-substrate (CoS) packaging and off-chip light source (e.g., laser diode) packaging. CoS packaging typically lack of protection against moisture (low MSL) and is housed and sealed in a "gold box". "Gold box" packaging, characterized by its non-SMT (surface mounted) back-end assembly, is not suitable for the integration of an optical platform such on-board optics (OBO). Furthermore, off-chip light source (laser diode) packaging typically requires a ceramic submount for heat dissipation and is actively aligned in 6 degree-of-freedom to couple light into the photonic integrated circuit (PIC). Similarly, fibre pig-tailing from the PIC to external system requires 6 degree-of-freedom active alignment as well.

SUMMARY OF THE INVENTION

It is an objective of the present invention to provide an integrated photonics package and a method of forming it, to create a surface mounted (SMT) compatible photonic package.

It is an objective of the present invention to provide an integrated photonics package and a method of forming it, to create a plastic encapsulated photonic package capable of MSL protection.

It is an objective of the present invention to provide an integrated photonics package and a method of forming it, which allows fibre pigtailing from the top of the photonic package.

It is an objective of the present invention to provide an integrated photonics package and a method of forming it, which allows passive assembly of an in-package light source (laser diode).

It is an objective of the present invention to provide an integrated photonics package and a method of forming it, which are capable of in-package heat dissipation from an embedded light source (laser diode).

The present invention provides an integrated photonics package encapsulated in a plastic encapsulation layer, consisting of an electrical signal module, a silicon photonics processing unit, a light-emitting (laser diode) unit, a micro-optical coupler and a heat sink structure, with the electrical signal module electrically connected and configured to both the silicon photonics processing unit and the light-emitting unit, the silicon photonics processing unit, the light-emitting unit and the micro-optical coupler spaced apart, the silicon photonics processing unit located between the light-emitting unit and the micro-optical coupler, the light-emitting unit configured to provide horizontal light, which is then processed by the silicon photonics processing unit and guided by the micro-optical coupler to vertically exit the integrated photonics package.

Optionally, the micro-optical coupler may include a plurality of waveguides, each having an input end and an output end perpendicular to and in optical communication with the input end, wherein after the horizontal light is processed by the silicon photonics processing unit, it horizontally enters the waveguide from the input end and vertically exits the waveguide from the output end.

Optionally, each of the waveguides may include a first section and a second section perpendicular to the first section, wherein a reflector is provided at an intersection of the first and second sections so as to form an acute angle of 45° with each of the first and second sections, wherein an end of the first section away from the reflector forms the input end and an end of the second section away from the reflector forms the output end so that the horizontal light enters the waveguide from the input end and is reflected by the reflector, and the reflected light is vertical and exits the output end.

Optionally, the input end may match the silicon photonics processing unit in mode and phase and the output end may match an optical fiber in mode and phase so that the horizontal light is able to horizontally enter the waveguide and vertically exit the waveguide at minimal signal loss.

Optionally, the output end may be located at an upper surface of the micro-optical coupler, wherein there is a recess in an upper surface of the plastic encapsulation layer, which exposes the output end, and wherein the micro-optical coupler is connected to the optical fiber at the recess.

Optionally, the electrical signal module may include a first electrical signal unit and a second electrical signal unit, the first electrical signal unit arranged on the silicon photonics processing unit and electrically connected to the silicon photonics processing unit, the second electrical signal unit arranged external to and spaced apart from the silicon photonics processing unit, the micro-optical coupler and the light-emitting unit.

Optionally, the integrated photonics package may further include an optical interface encapsulated in plastic encapsulation layer, which is disposed between an input end and the silicon photonics processing unit and between the silicon photonics processing unit and a light exit area and configured to guide the horizontal light emitted from the light-emitting unit to the silicon photonics processing unit and guide the horizontal light that has been processed by the silicon photonics processing unit to the input end.

Optionally, the integrated photonics package may further include first base supports and second base supports encapsulated in plastic encapsulation layer, the first base supports located under the silicon photonics processing unit, the second base supports located under the light-emitting unit, wherein lower surfaces of the first base supports and lower surfaces of the second base supports are exposed from a lower surface of the plastic encapsulation layer.

Optionally, the heat sink structure may be encapsulated in the plastic encapsulation layer, the heat sink structure located on the light-emitting unit so that an upper surface of the heat sink structure is exposed from the plastic encapsulation layer, the heat sink structure connected at the upper surface to an external system-level heat dissipation device.

Optionally, the heat sink structure may include a heat sink block, the heat sink block attached to the light-emitting unit via a thermal interface material.

Optionally, the heat sink block may have heat dissipation holes, the heat dissipation holes each extending through the heat sink block along its thickness, and the heat dissipation holes filled with a metallic material.

Optionally, the heat sink block may be made of silicon, wherein the metallic material is copper, and wherein the plastic encapsulation layer is made of an opaque resin.

Optionally, the second electrical signal unit, the silicon photonics processing unit and the light-emitting unit may all have electrical connection areas on their lower surfaces, which are exposed from the plastic encapsulation layer.

Optionally, the integrated photonics package may further include an interconnect structure, which is disposed on a lower surface of the plastic encapsulation layer and electrically connected to each of the second electrical signal unit, the silicon photonics processing unit and the light-emitting unit.

Optionally, the interconnect structure may have a plurality of solder pads formed thereon and the plurality of solder pads have solder balls formed thereon.

Optionally, the light-emitting unit may have a light exit area oriented toward the silicon photonics processing unit and the micro-optical coupler.

In another aspect, the present invention provides a method of forming an integrated photonics package as defined above, which includes the steps of:

attaching an electrical signal module, a silicon photonics processing unit, a light-emitting unit, a barrier mold, a heat sink structure and a micro-optical coupler to a temporary carrier, wherein: the electrical signal module is electrically connected to both the silicon photonics processing unit and the light-emitting unit and configured to provide the silicon photonics processing unit and the light-emitting unit with electrical signals; the silicon photonics processing unit, the light-emitting unit and the micro-optical coupler are spaced apart; the silicon photonics processing unit is located between the light-emitting unit and the micro-optical coupler; and the light-emitting unit is configured to provide horizontal light, which is then processed by the silicon photonics processing unit and guided by the micro-optical coupler to vertically exit the integrated photonics package;

filling a plastic encapsulation material between the electrical signal module, the silicon photonics processing unit, the light-emitting unit, the barrier mold and the micro-optical coupler and curing the plastic encapsulation material to form a plastic encapsulation layer.

Optionally, attaching the electrical signal module, the silicon photonics processing unit, the light-emitting unit and the micro-optical coupler to the temporary carrier may include:

providing the temporary carrier, which has an adhesive layer formed thereon;

attaching first base supports and second base supports to the temporary carrier at intervals;

assembling the silicon photonics processing unit onto the first base supports and assembling the light-emitting unit assembly onto the second base supports so that the silicon photonics processing unit and the light-emitting unit are spaced apart from and adjacent to each other;

arranging the electrical signal module, the micro-optical coupler, the barrier mold and the heat sink structure on the temporary carrier, the silicon photonics processing unit and the light-emitting unit; and dispensing an index-matching epoxy resin between the silicon photonics processing unit and the input end of the micro-optical coupler and between the silicon photonics processing unit and the light exit area of the light-emitting unit and curing the epoxy resin to form an optical interface.

Further, the electrical signal module may include a first electrical signal unit and a second electrical signal unit, wherein arranging the electrical signal module, the micro-optical coupler and the heat sink structure on the temporary carrier, the silicon photonics processing unit and the light-emitting unit includes:

arranging the first electrical signal unit on the silicon photonics processing unit by three-dimensional packaging so that the first electrical signal unit is electrically connected to the silicon photonics processing unit;

arranging the second electrical signal unit and the micro-optical coupler external to the silicon photonics processing unit and the light-emitting unit so that the silicon photonics processing unit is located between the micro-optical coupler and the light-emitting unit, that the light-emitting unit is located between the silicon photonics processing unit and the second electrical signal unit, that an output end of the micro-optical coupler is oriented toward the silicon photonics processing unit and that a light exit area of the light-emitting unit is oriented toward the silicon photonics processing unit;

arranging the barrier mold on an upper surface of the micro-optical coupler; and attaching the heat sink structure to an upper surface of the light-emitting unit via a thermal interface material.

Optionally, the formation of the plastic encapsulation layer may include:

filling the plastic encapsulation material between the electrical signal module, the silicon photonics processing unit, the light-emitting unit, the barrier mold and the micro-optical coupler and curing the plastic encapsulation material to form the plastic encapsulation layer, wherein the plastic encapsulation layer covers an upper surface of the micro-optical coupler, while a lower surface of the micro-optical coupler is exposed therefrom;

removing the barrier mold and the temporary carrier and forming a recess in the upper surface of the micro-optical coupler, which exposes the upper surface of the micro-optical coupler.

Optionally, the method may further include, subsequent to the formation of the plastic encapsulation layer:

forming a trench in a lower surface of the plastic encapsulation layer, which exposes electrical connection areas of the light-emitting unit and the silicon photonics processing unit, and filling the trench with a conductive material; and forming an interconnect structure on the lower surface of the plastic encapsulation layer, the interconnect structure electrically connected to both the conductive material and the electrical connection area of the second electrical signal unit, the interconnect structure having solder pads on its lower surface and solder balls on the solder pads.

Compared with the prior art, the present invention has the following benefits:

It provides an integrated photonics package and a method of forming it. The integrated photonics package includes, encapsulated in a plastic encapsulation layer, an electrical signal module, a silicon photonics processing unit, a light-emitting (laser diode) unit, a heat sink structure and a micro-optical coupler. The electrical signal module is electrically connected to both the silicon photonics processing unit and the light-emitting unit and configured to provide electrical signals to the silicon photonics processing unit and the light-emitting unit. The silicon photonics processing unit, the light-emitting unit and the micro-optical coupler are spaced apart, and the silicon photonics processing unit is located between the light-emitting unit and the micro-optical coupler. The light-emitting unit is configured to provide horizontal light, which is then processed by the silicon photonics processing unit and guided by the micro-optical coupler to vertically exit the integrated photonics package, thereby achieving in-package optical interconnection.

BRIEF DESCRIPTION OF THE DRAWING

The SOLE FIGURE is a schematic diagram showing the structure of an integrated photonics package according to an embodiment of the present invention.

In this figure:

10—plastic encapsulation layer; 11—recess; 21—first electrical signal unit; 22—second electrical signal unit; 23—silicon photonics processing unit; 24—light-emitting unit; 25—heat sink structure; 26—micro-optical coupler; 27—first base support; 28—second base support; 29—optical interface; 30—interconnect structure; 31—passivation layer; 32—metal interconnect layer; 33—solder pad; 40—solder ball.

DETAILED DESCRIPTION

Integrated photonics packages and their formation methods proposed in the present invention will be described in greater detail below. The present invention will be described in greater detail below with reference to the accompanying drawings, which present preferred embodiments of the invention. It would be appreciated that those skilled in the art can make changes to the invention disclosed herein while still obtaining the beneficial results thereof. Therefore, the following description shall be construed as being intended to be widely known by those skilled in the art rather than as limiting the invention.

For the sake of clarity, not all features of actual implementations are described. In the following, description and details of well-known functions and structures are omitted to avoid unnecessarily obscuring the invention. It should be appreciated that in the development of any such actual implementation, numerous implementation-specific decisions must be made to achieve specific goals of the developers, such as compliance with system-related and business-related constrains, which may vary from one implementation to another. Moreover, it should be appreciated that such a development effort might be complex and time consuming, but would nevertheless be a routine undertaking for those of ordinary skill in the art.

Objects and features of the present invention will become more apparent upon reading the following more detailed description of particular embodiments thereof with reference to the accompanying drawings. Note that the figures are provided in a very simplified form not necessarily drawn to exact scale and for the only purpose of facilitating easy and clear description of the disclosed embodiments.

It is to be noted that an upper surface of a plastic encapsulation layer is defined as its surface facing away from associated interconnect structures along its thickness (i.e., the vertically upper surface in the SOLE FIGURE), while a lower surface of the plastic encapsulation layer is defined as its surface facing toward the associated interconnect structures along its thickness (i.e., the vertically lower surface in the SOLE FIGURE).

The SOLE FIGURE is a schematic diagram showing the structure of an integrated photonics package according to an embodiment of the present invention. As shown in The SOLE FIGURE, the integrated photonics package of this embodiment includes, encapsulated in a plastic encapsulation layer 10, an electrical signal module, a silicon photonics processing unit 23, a light-emitting unit 24 and a micro-optical coupler 26. In this embodiment, encapsulating the electrical signal module, the silicon photonics processing unit 23, the light-emitting unit 24 and the micro-optical coupler 26, the plastic encapsulation layer 10 provides the integrated photonics package with protection against moisture and mechanical handling, which can facilitate subsequent assembly of the integrated photonics package onto system board.

The electrical signal module is electrically connected to both the silicon photonics processing unit 23 and the light-emitting unit 24 and configured to provide electrical signals to the silicon photonics processing unit 23 and the light-emitting unit 24. The silicon photonics processing unit 23, the light-emitting unit 24 and the micro-optical coupler 26 are spaced apart, and the silicon photonics processing unit 23 is located between the light-emitting unit 24 and the micro-optical coupler 26. The light-emitting unit 24 is configured to provide horizontal light, which is then processed by the silicon photonics processing unit 23 and guided by the micro-optical coupler 26 to vertically exit the integrated photonics package.

The light-emitting unit 24 has a light exit area oriented toward the silicon photonic unit 23 and the micro-optical coupler 26.

The micro-optical coupler 26 has a plurality of waveguides, each providing an optical path. All the waveguides are able to convert at least one horizontal light beam that has been processed by the silicon photonics processing unit 23 into a vertical light beam that exits vertically. Specifically, each of the waveguides has an input end and an output end, which is perpendicular to and in optical communication with the input end, thereby allowing horizontal light that enters the waveguide horizontally to alter its direction of travel and leave from the output end as a vertical beam. The output end is configured for connection with an external optical fiber. All the waveguides may be arranged at intervals. Preferably, centers of cross-sections of all the waveguides, which are perpendicular to both their input and output ends, are on the same straight line. The micro-optical coupler 26 is provided in its upper surface with two alignment apertures for connection with multi-push-on (MPO) connectors, which are spaced apart from each other on opposing sides of the output ends of all the waveguides to enable compatibility of the micro-optical coupler 26 with the pluggable MPO connectors.

In one embodiment, each of the waveguides includes a first section and a second section. The first and second sections are perpendicular to each other, and a reflector is arranged at their intersection so as to form an acute angle of 45° with each of the first and second sections. The input end is provided as the end of the first section away from the reflector, and the output end is provided as the end of the second section away from the reflector. With this configuration, horizontal light entering the waveguide from the input end will be reflected by the reflector, and the reflected light is vertical and exits the output end.

In another embodiment, the input end matches the silicon photonics processing unit 23 in mode and phase, and the output end matches the optical fiber in mode and phase. In this way, light can enter the waveguide horizontally and exits it vertically with minimal signal loss.

The upper surface of the micro-optical coupler 26 is exposed at an upper surface of the plastic encapsulation layer 10, and a lower surface of the micro-optical coupler 26 is exposed at a lower surface of the plastic encapsulation layer 10. The upper surface of the plastic encapsulation layer 10 is higher than the upper surface of the micro-optical coupler 26 so that there is a recess 11 in the plastic encapsulation layer 10 above the micro-optical coupler 26. An output end of the micro-optical coupler 26 is defined at its upper surface, and the micro-optical coupler 26 is connected to the optical fibers at the recess 11. In this way, the optical fibers can be attached to the top of the integrated photonics package.

The silicon photonics processing unit 23 is, for example, a silicon photonics integrated circuit (Si-PIC) chip. Without limitation, the light-emitting unit 24 may include a laser diode or an array of laser diodes. Example of a material from which the micro-optical coupler 26 can be fabricated may include, but are not limited to, silicon dioxide (glass), and the reflector may be surface finished by polishing the surface and coating an aluminum film thereon. The plastic encapsulation layer 10 is made of an opaque resin (e.g., a black opaque resin), which can prevent interference in the integrated photonics package from external environmental elements.

The electrical signal module includes a first electrical signal unit 21 and a second electrical signal unit 22. The first electrical signal unit 21 is situated on and electrically connected to the silicon photonics processing unit 23 so as to be able to provide the silicon photonics processing unit 23 with electrical signals. Preferably, the first electrical signal unit 21 may be electrically connected to the silicon photonics processing unit 23 using a three-dimensional packaging technique. The second electrical signal unit 22 is disposed external to, and spaced apart from, the silicon photonics processing unit 23, the micro-optical coupler 26 and the light-emitting unit 24. Upper surfaces of the first electrical signal unit 21 and the second electrical signal unit 22 are exposed at the upper surface of the plastic encapsulation layer 10, and a lower surface of the second electrical signal unit 22 is exposed at the lower surface of the plastic encapsulation layer 10. The second electrical signal unit 22 can be electrically connected to, for example, a device for power management. It may be also electrically connected to the light-emitting unit 24, for example, in order to monitor a temperature of the light-emitting unit 24.

In this embodiment, silicon photonics processing unit 23, the light-emitting unit 24, the first electrical signal unit 21 and the second electrical signal unit 22 all have electrical connection areas on their lower surfaces. The first electrical signal unit 21 is electrically connected to the silicon photonics processing unit 23 through its electrical connection area, and electrical connection areas of the silicon photonics processing unit 23, the light-emitting unit 24 and the second electrical signal unit 22 are all electrically connected to an interconnect structure 30. The first electrical signal unit 21 and the second electrical signal unit 22 may be, for example, electronic integrated circuit (EIC) chips.

The integrated photonics package further includes, encapsulated in the plastic encapsulation layer 10, an optical interface 29 and base supports 27, 28. The optical interface 29 is provided between the input ends and the silicon photonics processing unit 23 and between the silicon photonics processing unit 23 and the light exit area in order to guide horizontal light emitted from the light-emitting unit to the silicon photonics processing unit 23 to guide horizontal light that has been processed by the silicon photonics processing unit 23 to the input ends.

The base supports include first base supports 27 and the second base supports 28. The first base supports 27 are provided under the silicon photonics processing unit 23, and the second base supports 28 are provided under the light-emitting unit 24. Lower surfaces of the first base supports 27 and the second base supports 28 are exposed from the lower surface of the plastic encapsulation layer 10. The first base supports 27 and the second base supports 28 are used during the fabrication of the integrated photonics package to support the silicon photonics processing unit 23 and the light-emitting unit 24, respectively, with their heights controlled to ensure the verticality of optical axes (z-axes) of the light-emitting unit 24 and the silicon photonics processing unit 23, which is necessary for achieving optimum optical coupling therebetween.

The heights of the first base supports 27 and the second base supports 28 may be designed according to the actual structures of the related components (i.e., the light-emitting unit 24, the silicon photonics processing unit 23 and the micro-optical coupler 26). In this embodiment, the base supports are attached to light-emitting unit 24 and the silicon photonics processing unit 23 by electroplating so that the heights of the first base supports 27 and the second base supports 28 are precisely controlled to ensure that optical axes of the light-emitting unit 24 and the silicon photonics processing unit 23 are both oriented in the vertical direction (i.e., the thickness direction of the plastic encapsulation layer 10). In this way, alignment of the light-emitting unit 24 with the silicon photonics processing unit 23 can be obtained, achieving precise optical z-axis control of the light-emitting unit 24.

In this embodiment, examples of a material from which the first base supports 27 and the second base supports 28 can be fabricated may include, but are not limited to, metals. Preferably, the first base supports 27 and the second base supports 28 are made of copper. Further, in order to enable the copper base supports to be lighter in weight, the first base supports 27 and the second base supports 28 may be patterned.

The integrated photonics package further includes, encapsulated in the plastic encapsulation layer 10, a heat sink structure 25 residing on the light-emitting unit 24. An upper surface of the heat sink structure 25 is exposed from the plastic encapsulation layer 10, and the heat sink structure 25 is connected at the upper surface to an external system-level heat dissipation device. With this design, heat can be dissipated from the light-emitting unit 24 and the electrical signal module in the integrated photonics package to the system-level heat dissipation device. In this way, heat dissipation from the integrated photonics package can be achieved. The upper surface of the heat sink structure 25 exposed from the plastic encapsulation layer 10 is its surface facing away from the light-emitting unit 24.

In this embodiment, the heat sink structure 25 includes a silicon block. This heat sink block is attached to the light-emitting unit 24 via a thermal interface material (TIM) layer. The heat sink block may be made of silicon, for example. The heat sink block may have heat dissipation holes extending therethrough, and a metallic material (e.g., copper) may be filled in the heat dissipation holes to enhance the heat dissipation capability.

The integrated photonics package further includes an interconnect structure 30, which is provided on the lower surface of the plastic encapsulation layer 10 and electrically connected to the electrical signal module and the light-emitting unit 24.

Specifically, the interconnect structure 30 includes a passivation layer 31 and a metal interconnect layer 32 embedded in the passivation layer 31. The passivation layer 31 covers the plastic encapsulation layer 10 in such a manner that its upper surface contacts the lower surface of the plastic encapsulation layer 10. The metal interconnect layer 32 is electrically connected, on its side at the upper surface of the passivation layer 31, to the second electrical signal unit 22, the light-emitting unit 24 and the silicon photonics processing unit 23. Specifically, on the side at the upper surface of the passivation layer 31, the metal interconnect layer 32 is electrically connected to the second electrical signal unit 22. Moreover, on the same side, it extends into the plastic encapsulation layer 10 and is then electrically connected to the light-emitting unit 24 and the silicon photonics processing unit 23. The interconnect structure 30 has a plurality of solder pads 33 on its side at a lower surface of the passivation layer 31. The solder pads 33 are exposed from the passivation layer 31, and solder balls are formed on the solder pads 33 to enable the integrated photonics package to be subsequently soldered to another device (e.g., a circuit board). The solder balls enable the integrated photonics package to be SMT-assembled to a system circuit board.

In this embodiment, the passivation layer 31 is made of an insulating material such as a polymer material. For example, the polymer material may be one of polyimide, benzocyclobutene (BCB) and poly-p-phenylenebenzobisthiazole (PBO), or a combination thereof. The metal interconnect layer 32 may be a metal such as Cu, Ag, W or Au, a conductive alloy, an inorganic material such as a conductive oxide (e.g., ITO), or a conductive organic material such as a conductive polymer.

With continued reference to the SOLE FIGURE, in embodiments of the present invention, there is also provided a method of forming an integrated photonics package, which includes the steps as follows.

Step S1: Secure an electrical signal module, a silicon photonics processing unit 23, a light-emitting unit 24, a barrier mold and a micro-optical coupler 26 to a temporary carrier. The electrical signal module is electrically connected to both the silicon photonics processing unit 23 and the light-emitting unit 24 and configured to provide electrical signals to the silicon photonics processing unit 23 and the light-emitting unit 24. The silicon photonics processing unit 23, the light-emitting unit 24 and the micro-optical coupler 26 are spaced apart, and the silicon photonics processing unit 23 is located between the light-emitting unit 24 and the micro-optical coupler 26. The light-emitting unit 24 is configured to provide horizontal light, which is then guided by the silicon photonics processing unit 23 and the micro-optical coupler 26 to vertically exit the integrated photonics package. The barrier mold is made of a non-sticking material.

Specifically, in this step, the temporary carrier is first provided, and an adhesive layer is formed on a surface of the carrier. For example, the carrier has a circular or square shape.

Next, base supports are attached to the temporary carrier. Specifically, the base supports include first base supports 27 and second base supports 28, which are attached to the temporary carrier at intervals.

Subsequently, the silicon photonics processing unit 23 is attached to the first base supports 27, and the light-emitting unit 24 is attached to the second base supports 28 so that the silicon photonics processing unit 23 and the light-emitting unit 24 are adjacent to and spaced apart from each other.

Afterwards, the electrical signal module, the micro-optical coupler 26, the barrier mold and the heat sink structure 25 are arranged on the temporary carrier, the silicon photonics processing unit 23 and the light-emitting unit 24. Specifically, the electrical signal module includes a first electrical signal unit 21 and a second electrical signal unit 22. The first electrical signal unit 21 is arranged on the silicon photonics processing unit 23 by three-dimensional packaging so as to be electrically connected to the silicon photonics processing unit 23. The second electrical signal unit 22 and the micro-optical coupler 26 are disposed external to the silicon photonics processing unit 23 and the light-emitting unit 24 so that the silicon photonics processing unit 23 is located between the micro-optical coupler 26 and the light-emitting unit 24 and that the light-emitting unit 24 is located between the silicon photonics processing unit 23 and the second electrical signal unit 22. Moreover, an output end of the micro-optical coupler 26 is oriented toward the silicon photonics processing unit 23, and a light exit area of the light-emitting unit 24 is oriented toward the silicon photonics processing unit 23. The barrier mold is arranged on an upper surface of the micro-optical coupler 26, and the heat sink structure 25 is attached to an upper surface of the light-emitting unit 24 via a thermal interface material.

Following that, an index-matching epoxy resin is dispensed between the silicon photonics processing unit 23 and an input end of the micro-optical coupler 26 and between the silicon photonics processing unit 23 and the light exit area of the light-emitting unit 24 and cured, resulting in an optical interface 29.

Step S2: Fill a plastic encapsulation material between the electrical signal module, the silicon photonics processing unit 23, the light-emitting unit 24, the barrier mold and the micro-optical coupler 26 and cure the plastic encapsulation material to form a plastic encapsulation layer 10.

Specifically, the plastic encapsulation material is first filled between the electrical signal module, the silicon photonics processing unit 23, the light-emitting unit 24, the barrier mold and the micro-optical coupler 26 and cured to form the plastic encapsulation layer 10. The upper surface of the micro-optical coupler 26 is covered by the resulting plastic encapsulation layer 10, while a lower surface of the micro-optical coupler 26 is exposed therefrom.

The barrier mold and the temporary carrier are then removed, and a recess is formed above the upper surface of the micro-optical coupler 26. That is, the upper surface of the micro-optical coupler 26 is exposed in the recess.

After step S2 is complete, the method may further include the following steps:

Step S3: Form trenches in a lower surface of the plastic encapsulation layer 10, expose electrical connection areas of the light-emitting unit 24 and the silicon photonics processing unit 23, and fill the trenches with a conductive material.

Step S4: Forming an interconnect structure 30 on the lower surface of the plastic encapsulation layer 10, which is electrically connected to the conductive material and an electrical connection area of the second electrical signal unit 22. The interconnect structure 30 has solder pads 33 on its lower surface, and solder balls 40 are formed on the solder pads 33.

Specifically, in this step, a first passivation layer is first formed on the lower surface of the plastic encapsulation layer 10, which has a first trench exposing the electrical connection area of the second electrical signal unit 22 and the conductive material.

Next, a first metal layer is formed on the first passivation layer so as to fill up the first trench. Thus, the first metal layer is electrically connected to the second electrical signal unit 22, the light-emitting unit 24 and the silicon photonics processing unit 23.

Subsequently, a second passivation layer is formed on the first passivation layer and the first metal layer, which has a second trench exposing part of the first metal layer.

Thereafter, a second metal layer is formed in the second trench so as to be electrically connected to the first metal layer. Moreover, the solder pads 33 are formed on a lower surface of the second metal layer so as to be exposed from the second passivation layer 31.

Afterward, the solder balls 40 are formed on the solder pads 33 by ball grid array (BGA) packaging.

In summary, the present invention provides an integrated photonics package and a method of forming it. The integrated photonics package includes, encapsulated in a plastic encapsulation layer, an electrical signal module, a silicon photonics processing unit, a light-emitting unit and a micro-optical coupler. The electrical signal module is electrically connected to both the silicon photonics processing unit and the light-emitting unit and configured to provide electrical signals to the silicon photonics processing unit and the light-emitting unit. The silicon photonics processing unit, the light-emitting unit and the micro-optical coupler are spaced apart, and the silicon photonics processing unit is located between the light-emitting unit and the micro-optical coupler. The light-emitting unit is configured to provide horizontal light, which is then processed by the silicon photonics processing unit and guided by the micro-optical coupler to vertically exit the integrated photonics package, thereby achieving in-package optical interconnection. The present invention provides an integrated photonics package capable of transmitting data at a higher rate (e.g., over 800 G).

It is to be noted that, as used herein, the terms "first" and "second" are only meant to distinguish various components, elements, steps, etc. from each other rather than indicate logical or sequential orderings thereof, unless otherwise indicated or specified.

It is to be understood that while the invention has been described above with reference to preferred embodiments thereof, it is not limited to these embodiments. In light of the above teachings, any person familiar with the art may make many possible modifications and variations to the disclosed embodiments or adapt them into equivalent embodiments, without departing from the scope of the invention. Accordingly, it is intended that any and all simple variations, equivalent changes and modifications made to the foregoing embodiments based on the substantive disclosure of the invention without departing from the scope thereof fall within this scope.

What is claimed is:

1. An integrated photonics package encapsulated in a plastic encapsulation layer, comprising, an electrical signal module, a silicon photonics processing unit, a light-emitting unit, a heat sink structure and a micro-optical coupler, the electrical signal module electrically connected and configured to both the silicon photonics processing unit and the light-emitting unit, the silicon photonics processing unit, the light-emitting unit and the micro-optical coupler spaced apart, the silicon photonics processing unit located between the light-emitting unit and the micro-optical coupler, the light-emitting unit configured to provide horizontal light, which is then processed by the silicon photonics processing unit and guided by the micro-optical coupler to vertically exit the integrated photonics package.

2. The integrated photonics package of claim 1, wherein the micro-optical coupler comprises a plurality of waveguides, each having an input end and an output end perpendicular to and in optical communication with the input end, wherein after being processed by the silicon photonics processing unit, the horizontal light horizontally enters the waveguide from the input end and vertically exits the waveguide from the output end.

3. The integrated photonics package of claim 2, wherein each of the waveguides comprises a first section and a second section perpendicular to the first section, wherein a reflector is provided at an intersection of the first and second sections so as to form an acute angle of 45° with each of the first and second sections, wherein an end of the first section away from the reflector forms the input end and an end of the second section away from the reflector forms the output end so that the horizontal light enters the waveguide from the input end and is reflected by the reflector, and the reflected light is vertical and exits the output end.

4. The integrated photonics package of claim 2, wherein the input end matches the silicon photonics processing unit in mode and phase and the output end matches an optical fiber in mode and phase so that the horizontal light is able to horizontally enter the waveguide and vertically exit the waveguide at minimal signal loss; and/or wherein the output end is located at an upper surface of the micro-optical coupler, wherein an upper surface of the plastic encapsulation layer is formed with a recess, the recess exposing the output end, and wherein the micro-optical coupler is connected to the optical fiber at the recess.

5. The integrated photonics package of claim 2, wherein the electrical signal module comprises a first electrical signal unit and a second electrical signal unit, the first electrical signal unit arranged on the silicon photonics processing unit and electrically connected to the silicon photonics processing unit, the second electrical signal unit arranged external to and spaced apart from the silicon photonics processing unit, the micro-optical coupler and the light-emitting unit.

6. The integrated photonics package of claim 2, further comprising an optical interface encapsulated in plastic encapsulation layer, the optical interface disposed between an input end and the silicon photonics processing unit and between the silicon photonics processing unit and a light exit area and configured to guide the horizontal light emitted from the light-emitting unit to the silicon photonics processing unit and guide the horizontal light that has been processed by the silicon photonics processing unit to the input end.

7. The integrated photonics package of claim 1, further comprising first base supports and second base supports encapsulated in plastic encapsulation layer, the first base supports located under the silicon photonics processing unit, the second base supports located under the light-emitting unit, wherein lower surfaces of the first base supports and lower surfaces of the second base supports are exposed from a lower surface of the plastic encapsulation layer.

8. The integrated photonics package of claim 1, wherein the heat sink structure is encapsulated in the plastic encapsulation layer, the heat sink structure located on the light-emitting unit, an upper surface of the heat sink structure exposed from the plastic encapsulation layer, the heat sink structure connected at the upper surface to an external system-level heat dissipation device.

9. The integrated photonics package of claim 8, wherein the heat sink structure comprises a heat sink block, the heat sink block attached to the light-emitting unit via a thermal interface material.

10. The integrated photonics package of claim 9, wherein the heat sink block has heat dissipation holes, the heat dissipation holes each extending through the heat sink block along a thickness thereof, and the heat dissipation holes filled with a metallic material.

11. The integrated photonics package of claim 10, wherein the heat sink block is made of silicon, wherein the metallic material is copper, and wherein the plastic encapsulation layer is made of an opaque resin.

12. The integrated photonics package of claim 5, wherein lower surfaces of the second electrical signal unit, the silicon photonics processing unit and the light-emitting unit all have electrical connection areas, the electrical connection areas of the second electrical signal unit, the silicon photonics processing unit and the light-emitting unit exposed from the plastic encapsulation layer.

13. The integrated photonics package of claim 5, further comprising an interconnect structure, which is disposed on a lower surface of the plastic encapsulation layer and electrically connected to each of the second electrical signal unit, the silicon photonics processing unit and the light-emitting unit.

14. The integrated photonics package of claim 13, wherein a lower surface of the interconnect structure has a plurality of solder pads formed thereon and the plurality of solder pads have solder balls formed thereon.

15. The integrated photonics package of claim 1, wherein the light-emitting unit has a light exit area oriented toward the silicon photonics processing unit and the micro-optical coupler.

16. A method of forming an integrated photonics package as defined in claim 1, comprising the steps of:
attaching an electrical signal module, a silicon photonics processing unit, a light-emitting unit, a barrier mold, a heat sink structure and a micro-optical coupler to a temporary carrier, wherein: the electrical signal module is electrically connected to both the silicon photonics processing unit and the light-emitting unit and configured to provide the silicon photonics processing unit and the light-emitting unit with electrical signals; the silicon photonics processing unit, the light-emitting unit and the micro-optical coupler are spaced apart; the silicon photonics processing unit is located between the light-emitting unit and the micro-optical coupler; and the light-emitting unit is configured to provide horizontal light, which is then processed by the silicon photonics processing unit and guided by the micro-optical coupler to vertically exit the integrated photonics package;
filling a plastic encapsulation material between the electrical signal module, the silicon photonics processing unit, the light-emitting unit, the barrier mold and the micro-optical coupler and curing the plastic encapsulation material to form a plastic encapsulation layer.

17. The method of claim 16, wherein attaching the electrical signal module, the silicon photonics processing unit, the light-emitting unit and the micro-optical coupler to the temporary carrier comprises:
providing the temporary carrier, a surface of the temporary carrier has an adhesive layer formed thereon;
attaching first base supports and second base supports to the temporary carrier at intervals;
assembling the silicon photonics processing unit onto the first base supports and assembling the light-emitting unit assembly onto the second base supports so that the silicon photonics processing unit and the light-emitting unit are spaced apart from and adjacent to each other;
arranging the electrical signal module, the micro-optical coupler, the barrier mold and the heat sink structure on the temporary carrier, the silicon photonics processing unit and the light-emitting unit; and
dispensing an index-matching epoxy resin between the silicon photonics processing unit and the input end of the micro-optical coupler and between the silicon photonics processing unit and the light exit area of the light-emitting unit and curing the epoxy resin to form an optical interface.

18. The method of claim 17, wherein the electrical signal module comprises a first electrical signal unit and a second electrical signal unit, and wherein arranging the electrical signal module, the micro-optical coupler and the heat sink structure on the temporary carrier, the silicon photonics processing unit and the light-emitting unit comprises:
arranging the first electrical signal unit on the silicon photonics processing unit by three-dimensional packaging so that the first electrical signal unit is electrically connected to the silicon photonics processing unit;
arranging the second electrical signal unit and the micro-optical coupler external to the silicon photonics processing unit and the light-emitting unit, wherein the silicon photonics processing unit is located between the micro-optical coupler and the light-emitting unit, the light-emitting unit is located between the silicon photonics processing unit and the second electrical signal unit, an output end of the micro-optical coupler is oriented toward the silicon photonics processing unit and a light exit area of the light-emitting unit is oriented toward the silicon photonics processing unit;
arranging the barrier mold on an upper surface of the micro-optical coupler; and
attaching the heat sink structure to an upper surface of the light-emitting unit via a thermal interface material.

19. The method of claim 16, wherein the formation of the plastic encapsulation layer comprises:
filling the plastic encapsulation material between the electrical signal module, the silicon photonics processing unit, the light-emitting unit, the barrier mold and the micro-optical coupler and curing the plastic encapsulation material to form the plastic encapsulation layer, wherein the plastic encapsulation layer covers an upper surface of the micro-optical coupler, while a lower surface of the micro-optical coupler is exposed therefrom;
removing the barrier mold and the temporary carrier and forming a recess in the upper surface of the micro-optical coupler, which exposes the upper surface of the micro-optical coupler.

20. The method of claim 16, further comprising, subsequent to the formation of the plastic encapsulation layer:
forming a trench in a lower surface of the plastic encapsulation layer, which exposes electrical connection areas of the light-emitting unit and the silicon photonics processing unit, and filling the trench with a conductive material; and
forming an interconnect structure on the lower surface of the plastic encapsulation layer, the interconnect structure electrically connected to both the conductive material and the electrical connection area of the second electrical signal unit, a lower surface of the interconnect structure having a plurality of solder pads formed thereon and the plurality of solder pads having solder balls formed thereon.

* * * * *